US010594031B1

(12) United States Patent
West et al.

(10) Patent No.: US 10,594,031 B1
(45) Date of Patent: Mar. 17, 2020

(54) RADIO FREQUENCY INTEGRATED CIRCUIT FEED MANIFOLD FOR ACTIVE ELECTRONICALLY SCANNED ARRAY

(71) Applicant: Rockwell Collins, Inc., Cedar Rapids, IA (US)

(72) Inventors: James B. West, Cedar Rapids, IA (US); Michael L. Hageman, Mount Vernon, IA (US); Russell D. Wyse, Center Point, IA (US)

(73) Assignee: ROCKWELL COLLINS, INC., Cedar Rapids, IA (US)

( * ) Notice: Subject to any disclaimer, the term of this patent is extended or adjusted under 35 U.S.C. 154(b) by 152 days.

(21) Appl. No.: 15/697,262

(22) Filed: Sep. 6, 2017

(51) Int. Cl.
*H01Q 3/26* (2006.01)
*H01Q 21/00* (2006.01)
*H01L 23/00* (2006.01)
*H01P 1/185* (2006.01)

(52) U.S. Cl.
CPC ............ *H01Q 3/2682* (2013.01); *H01L 24/24* (2013.01); *H01P 1/185* (2013.01); *H01Q 3/26* (2013.01); *H01Q 21/00* (2013.01); *H01Q 21/0025* (2013.01)

(58) Field of Classification Search
CPC .. H01Q 3/2682; H01Q 21/24; H01Q 21/0025; H01Q 21/0006; H01Q 3/26; H01Q 21/0087; H01Q 13/10; H01Q 21/00; H01P 1/185; H01L 24/24

USPC .......................................................... 343/754
See application file for complete search history.

(56) References Cited

U.S. PATENT DOCUMENTS

| | | | |
|---|---|---|---|
| 5,592,178 A * | 1/1997 | Chang | H01Q 3/22 342/154 |
| 8,817,672 B2 * | 8/2014 | Corman | H01Q 3/26 370/278 |
| 9,653,820 B1 * | 5/2017 | West | H01Q 21/24 |
| 9,735,469 B1 | 8/2017 | West et al. | |
| 2011/0248796 A1 * | 10/2011 | Pozgay | G01S 13/4463 333/137 |
| 2017/0070247 A1 * | 3/2017 | Hageman | H04B 17/12 |

* cited by examiner

*Primary Examiner* — Hai V Tran
(74) *Attorney, Agent, or Firm* — Donna P. Suchy; Daniel M. Barbieri

(57) ABSTRACT

Systems and apparatuses include a radiating element, a radio frequency integrated circuit and a feed manifold. The radio frequency integrated circuit includes a splitter/combiner in communication with the radiating element, a transmit beam gain control block in communication with the splitter/combiner and structured to apply a Taylor weighting distribution, a receive beam gain control block in communication with the splitter/combiner and structured to apply a Bayliss weighting distribution, a transmit beam steering control block in communication with the transmit beam gain control block, and a receive beam steering control block in communication with the receive beam gain control block. The feed manifold is in communication with the transmit beam steering control block and the receive beam steering control block.

22 Claims, 10 Drawing Sheets

RADIO FREQUENCY INTEGRATED CIRCUIT FEED MANIFOLD FOR ACTIVE ELECTRONICALLY SCANNED ARRAY

BACKGROUND

Multi-channel monopulse direction finding systems can include a monopulse amplitude comparator arranged to communicate four or more channels via a four-quadrant (or more than four segment) aperture. A transmit (Tx) sum channel, a receive (Rx) sum channel, an elevation difference (Delta El) channel, and an azimuth difference (Delta Az) channel are used to determine an angle of arrival in three-dimensions.

Active Electronically Scanned Arrays (AESA), also known as phased array antennas, require accurate phase shift for beam pointing. AESAs require amplitude taper and high phase precision for low side lobe levels (SLL). Precision aperture phase and amplitude control is required for high performance AESAs including a flat, analog like phase with low RMS error, and low SLL analog like amplitude taper with tens of dBs of dynamic range across the array aperture with a tight phase response.

Monopulse antenna systems create three simultaneous beams to process a single radar pulse for precise direction finding. Monopulse antenna system utilize a 4-quadrant aperture dividing a transmit sum beam, a receive sum beam, an elevation difference beam, and an azimuth difference beam. A high central beam gain and low side lobes are desirable in the radiation pattern for the transmit sum beam and the receive sum beam, and a low null signal and low side lobes are desirable in the elevation difference beam and the azimuth difference beam.

Taylor weighting is applied to radiating elements of a monopulse antenna system in order to minimize beam width broadening and to reduce side lobe level gain. For example, FIG. 1 shows a Taylor weighting distribution 20 for a thirty-two element one dimensional array. This Taylor weighting distribution 20 results in two equal side lobe patterns and maximum side lobe gain is about twenty-five decibels below the peak gain of the central beam. The dynamic range of the Taylor weighting distribution 20 is about 8.7 decibels and the pattern provides a flat phase front for the beam.

Bayliss weighting is applied to radiating elements to optimize a null slope for difference beams and to reduce side lobe level gain. A Bayliss weighting provides a negative weight for half of the array. For example, FIG. 1 also shows a Bayliss weighting distribution 24 for a thirty-two element one dimensional array. The maximum side lobe gain is about twenty decibels below the peak gain. The dynamic range of the Bayliss weighting distribution 24 is about 17.8 decibels.

Current monopulse antenna systems cannot utilize both Taylor weighting and Bayliss weighting. Rather, current monopulse antenna systems utilize a split Taylor weighting for difference beams. In a split Traylor weighting, half of the radiating elements in the array follow a normal Taylor weighting distribution and the other half of the radiating elements follow a Taylor weighting with a one-hundred-eighty degree (180°) phase shift resulting in negative weights following the Taylor weighting.

FIG. 2 shows a Taylor weighted gain pattern 28 and a uniform gain pattern 32. The Taylor weighted gain pattern provides an improved beam including lower gain side lobes. FIG. 3 shows a Bayliss weighted gain pattern 36, a split Taylor weighted gain pattern 40, and a uniform gain pattern 44. The Bayliss weighted gain pattern 36 provides significantly lower side lobe gain levels.

SUMMARY

In one aspect, embodiments of the inventive concepts disclosed herein are directed to an apparatus including a radio frequency integrated circuit that includes a splitter/combiner structured to communicate with a radiating element, a sum beam gain control block in communication with the splitter/combiner and structured to apply a Taylor weighting distribution, a difference beam gain control block in communication with the splitter/combiner and structured to apply a Bayliss weighting distribution, a sum beam steering control block in communication with the sum beam gain control block, and a difference beam steering control block in communication with the difference beam gain control block.

In a further aspect, embodiments of the inventive concepts disclosed herein are directed to a system including a radiating element, a radio frequency integrated circuit and a feed manifold. The radio frequency integrated circuit includes a splitter/combiner in communication with the radiating element, a transmit beam gain control block in communication with the splitter/combiner and structured to apply a Taylor weighting distribution, a receive beam gain control block in communication with the splitter/combiner and structured to apply a Bayliss weighting distribution, a transmit beam steering control block in communication with the transmit beam gain control block, and a receive beam steering control block in communication with the receive beam gain control block. The feed manifold is in communication with the transmit beam steering control block and the receive beam steering control block.

In a further aspect, embodiments of the inventive concepts disclosed herein are directed to a method of assembling an antenna array. The method includes providing a feed manifold, coupling a plurality of radio frequency integrated circuits to the feed manifold, and coupling a plurality of radiating elements to the plurality of radio frequency integrated circuits. Each radio frequency integrated circuit includes a splitter/combiner, a transmit beam gain control block in communication with the splitter/combiner and structured to apply a Taylor weighting distribution, a receive beam gain control block in communication with the splitter/combiner and structured to apply a Bayliss weighting distribution, a transmit beam steering control block in communication with the transmit beam gain control block, and a receive beam steering control block in communication with the receive beam gain control block. Each radiating element is in communication with an associated splitter/combiner.

BRIEF DESCRIPTION OF THE FIGURES

Exemplary embodiments will become more fully understood from the following detailed description, taken in conjunction with the accompanying drawings, wherein like reference numerals refer to like elements, and.

DETAILED DESCRIPTION

Following below are more detailed descriptions of various concepts related to, and implementations of, methods, apparatuses, and systems for a monopulse feed manifold. The various concepts introduced above and discussed in greater detail below may be implemented in any number of ways, as the concepts described are not limited to any particular manner of implementation. Examples of specific implementations and applications are provided primarily for illustrative purposes.

Referring to the figures generally, the various embodiments disclosed herein relate to systems, apparatuses, and methods for a radio frequency integrated circuit (RFIC) based monopulse active electronically scanned array (AESA) feed manifold. The feed manifold includes independent amplification of a transmit (Tx) sum channel, a receive (Rx) sum channel, an elevation difference (Delta El) channel, and an azimuth difference (Delta Az) channel. The feed manifold can also include independent control of phase shift units or time delay units associated with each channel. In some embodiments, the Tx sum channel and the Rx sum channel are amplified according to a Taylor weighting scheme, while the Delta El channel and the Delta Az channel are amplified according to a Bayliss weighting scheme. Taylor weighting the sum channels minimizes beam broadening for a given side lobe level design. Bayliss weighting the Delta channels optimizes a null slope for a difference beam for a given side lobe level design. The ability to weight the four channels independently reduces side lobe levels and quantized side lobes. The ability to repurpose and reconfigure the two delta channels (and all 4 channels in general) enable the AESA to operate in a number of different modes (e.g., search and track, terrain following, SAR imaging, Comms, EW SIGINT, etc.).

Figure 1:
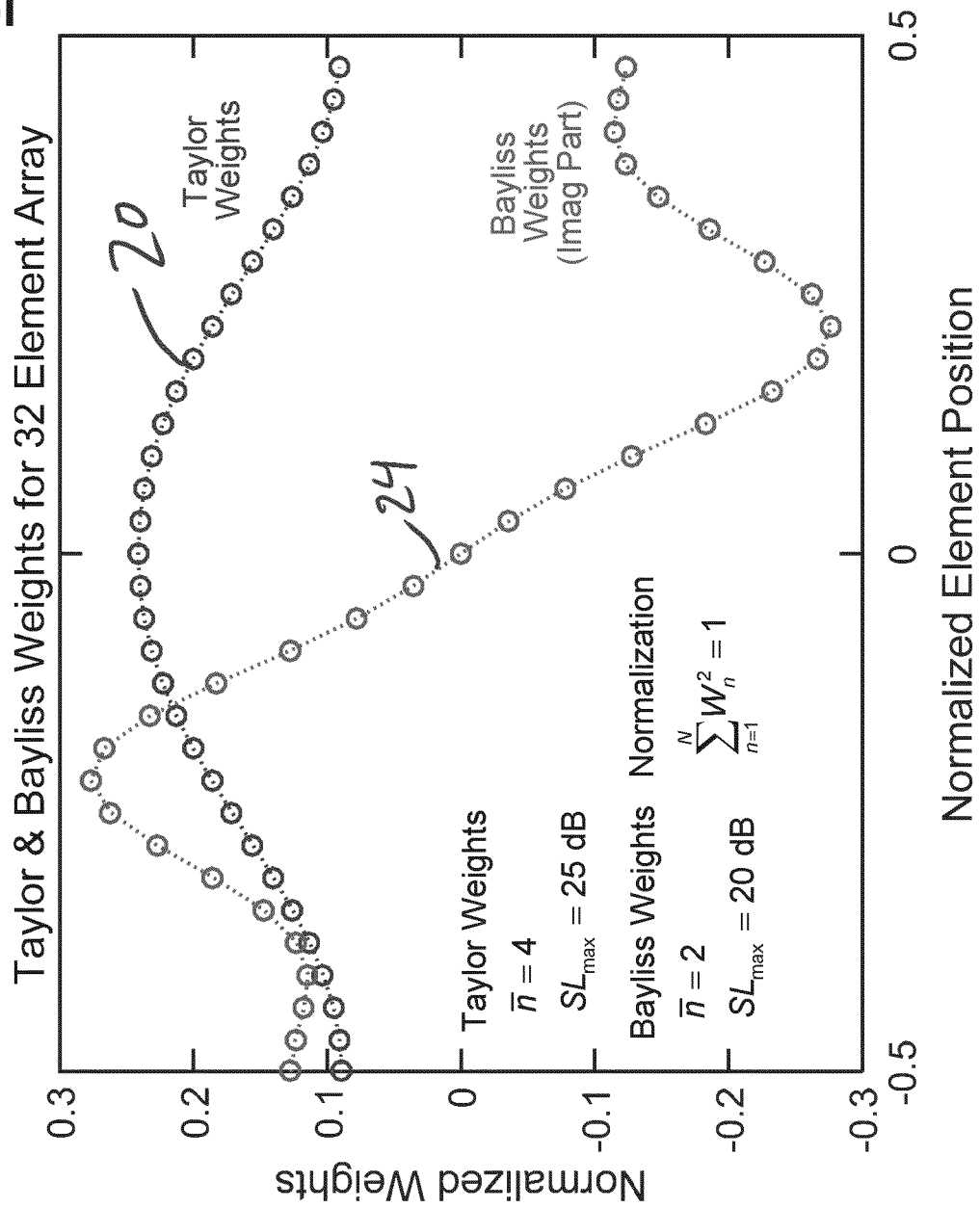
FIG. 1 is a graph showing amplification weighting for a thirty-two element array used in a direction finding system, in accordance with an exemplary embodiment.
Figure 2:
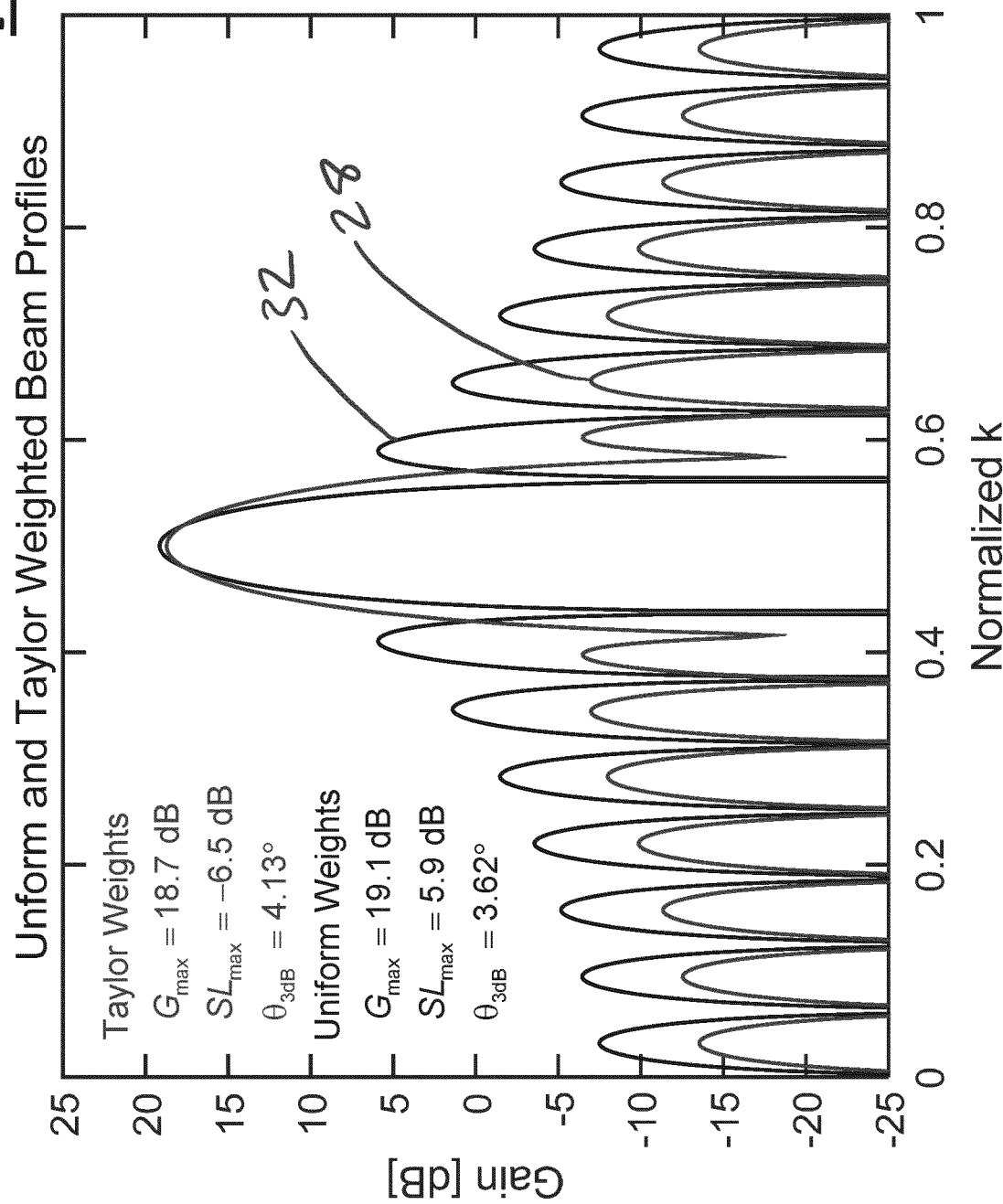
FIG. 2 is a graph comparing the gain pattern of a Taylor weighted array to a uniform weighted array, in accordance with an exemplary embodiment.
Figure 3:
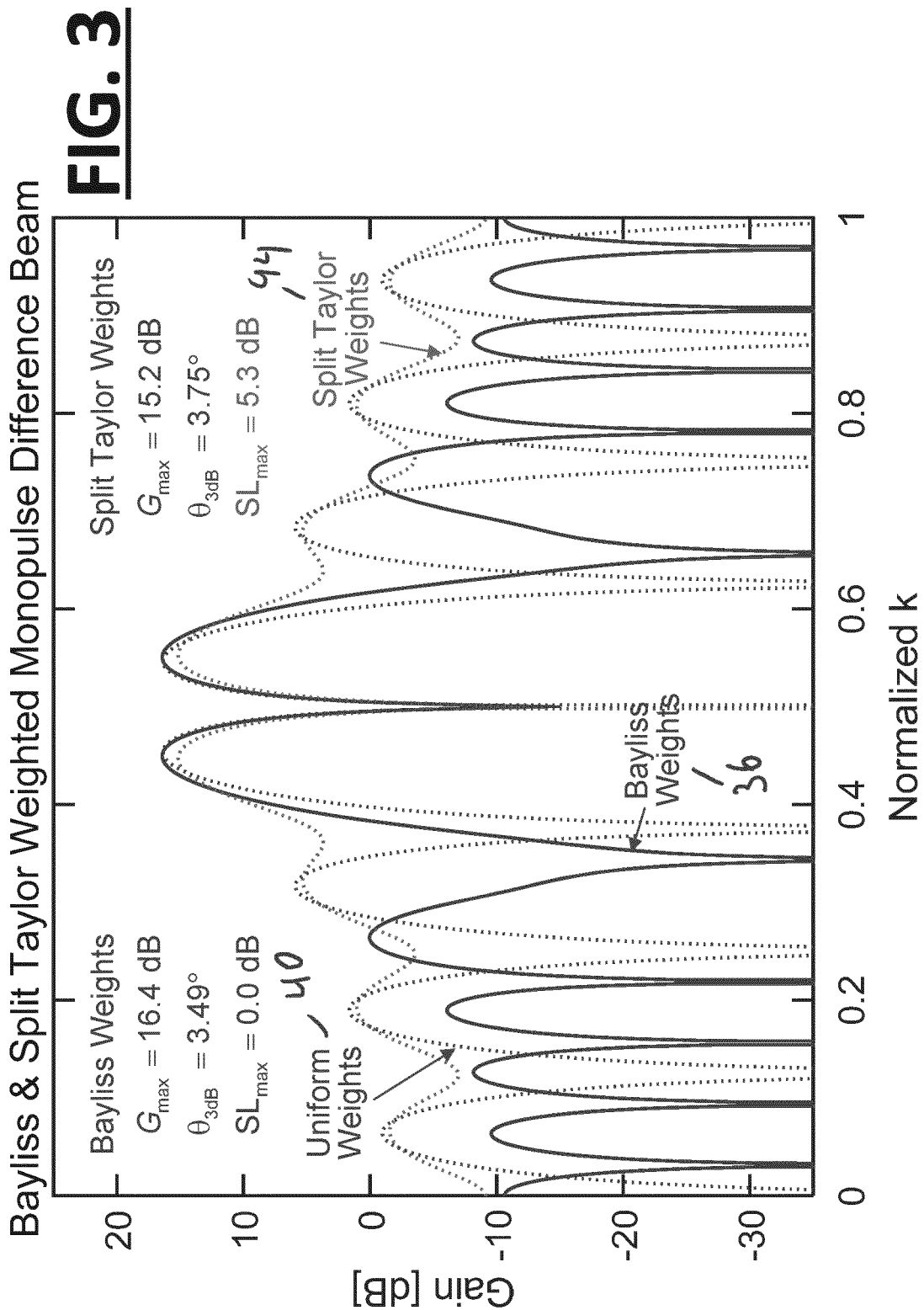
FIG. 3 is a graph comparing the gain pattern of a Bayliss weighted array to a uniform weighted array and a Split Taylor weighted array, in accordance with an exemplary embodiment.
Figure 4:
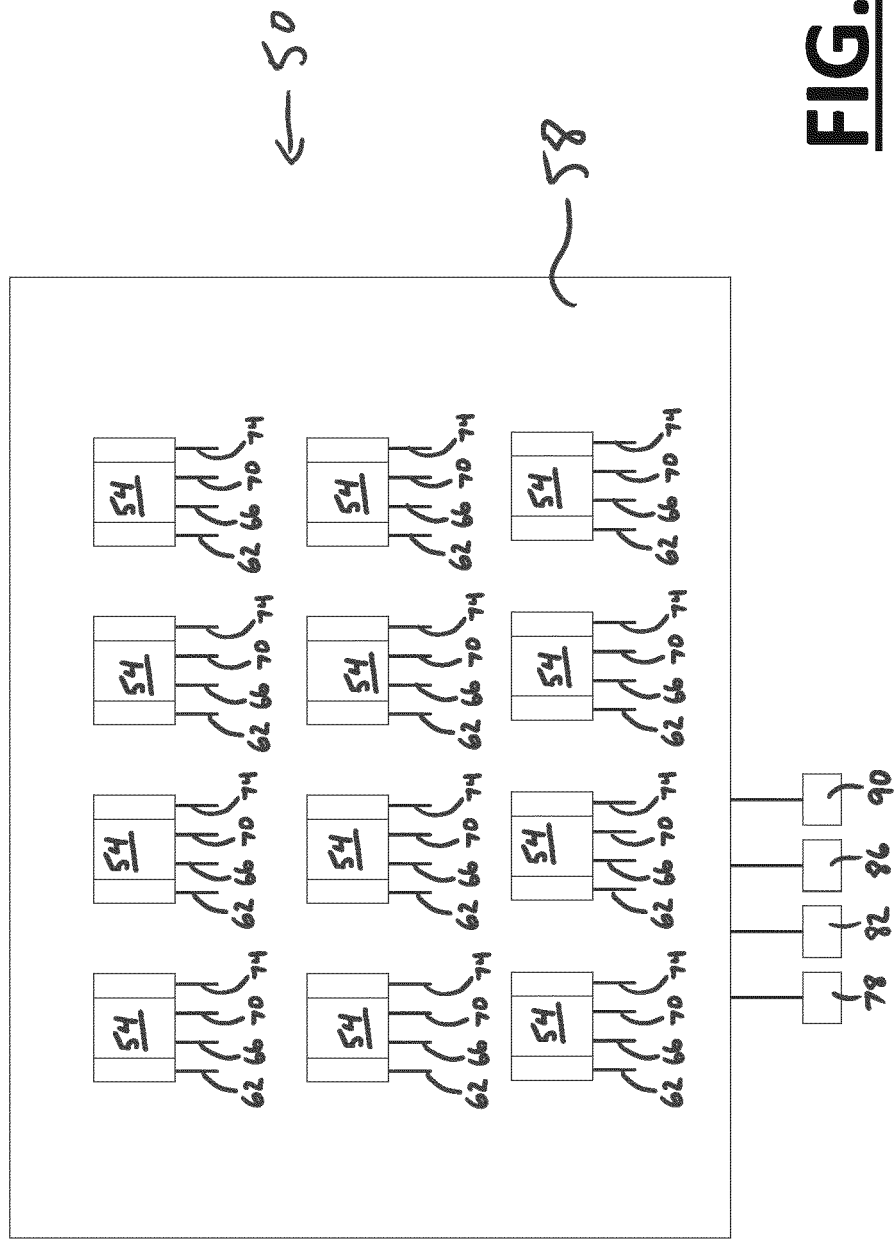
FIG. 4 is a schematic representation of a two-layer active electronically scanned array (AESA) that includes twelve subarray units, in accordance with an exemplary embodiment.

Referring now to FIG. 4, an antenna array 50 includes twelve subarray unit cells 54 each including four channels connected to a second layer in the form of a combiner/splitter layer 58. The combination of the unit cells 54 by the combiner/splitter layer 58 provides a full aperture AESA. In some embodiments, more that twelve or less than twelve unit cells 54 are connected to the combiner/splitter layer 58. In some embodiments, the four channels include a transmit sum channel 62, a receive sum channel 66, an elevation difference channel 70 and an azimuth difference channel 74. In some embodiments, more than four channels are included on each unit cell 54. In some examples eight or more channels are included. The combiner/splitter layer 58 also includes output channels or an output bus. In some embodiments, the combiner/splitter layer 58 includes a transmit output 78, a receive output 82, an elevation output 86, and an azimuth output 90. In some embodiments, the unit cells 54 and the combiner splitter layer 58 are realized on a radio frequency integrated circuit (RFIC). In some embodiments, the unit cells 54 are passive units, active units, or a combination of passive and active units (e.g., some unit cells 54 are passive and some unit cells 54 are active, each unit cell includes active portions and passive portions, etc.). In some embodiments, the combiner/splitter layer 58 is an active layer, a passive layer, or a combination of active and passive portions. In some embodiments, the antenna array 50 includes multiple combiner/splitter layers 58 and some or all of the combiner/splitter layers 58 may be active, passive, or a combination of active and passive.

Figure 5:
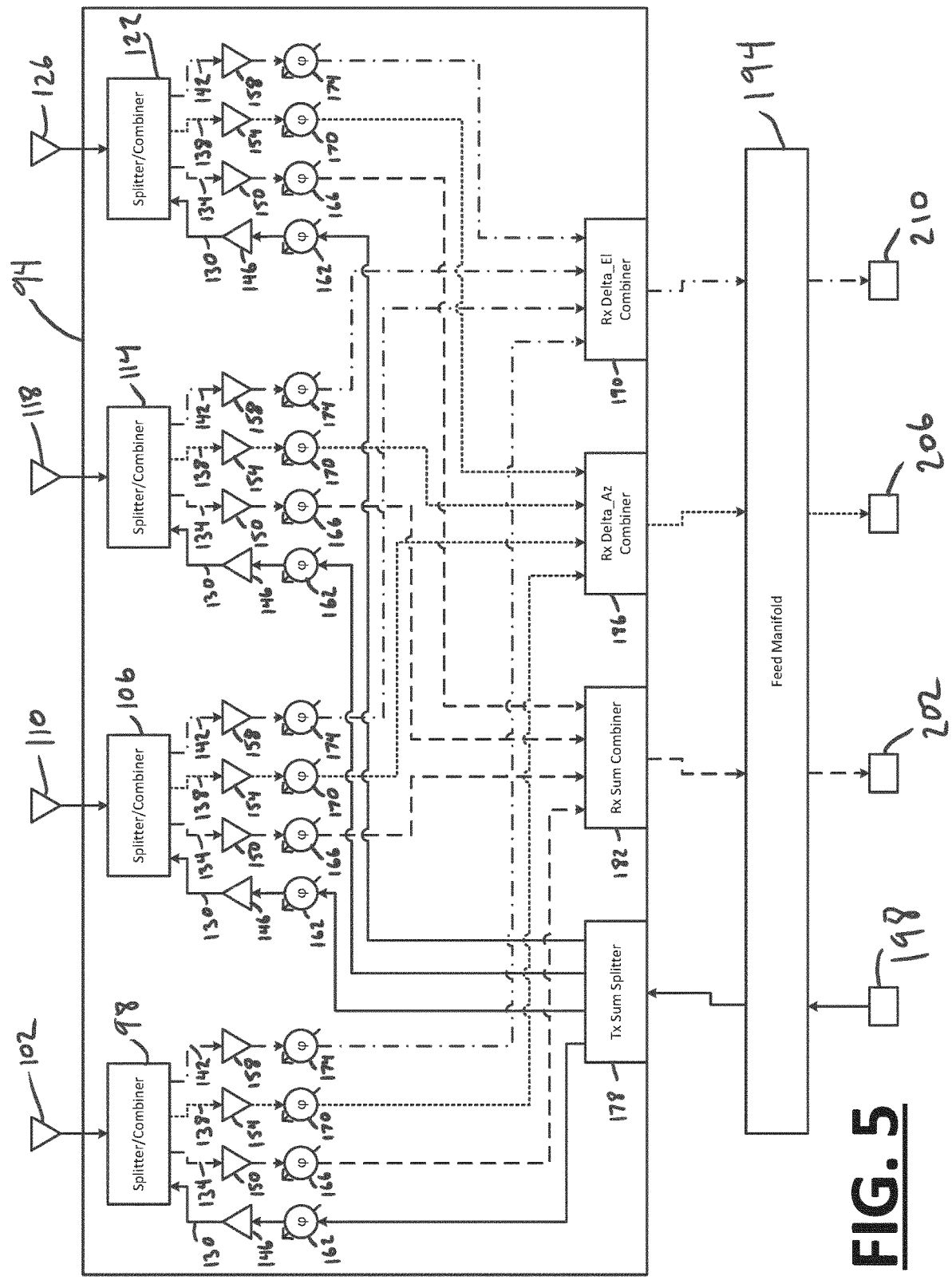
FIG. 5 is a schematic representation of a subarray unit, in accordance with an exemplary embodiment.

Referring now to FIG. 5, a unit cell in the form of a radio frequency integrated circuit (RFIC) 94 includes a first splitter/combiner 98 in communication with a first radiating element 102, a second splitter/combiner 106 in communication with a second radiating element 110, a third splitter/combiner 114 in communication with a third radiating element 118, and a fourth splitter/combiner 122 in communication with a fourth radiating element 126. In some embodiments, more than four splitter/combiners or less than four splitter/combiners are included. In some embodiments, thirty-two radiating elements are included in an array.

Each splitter/combiner 98, 106, 114, 122 includes four buses. In some embodiments, more than four buses may be included, for example each splitter/combiner may include eight output buses. Each splitter/combiner 98, 106, 114, 122 includes a transmit bus 130, a receive bus 134, an azimuth bus 138, and an elevation bus 142. Each transmit bus 130 is structured in communication with a transmit variable gain amplifier (VGA) 146, each receive bus 134 is structured in communication with a receive VGA 150, each azimuth bus 138 is structured in communication with an azimuth VGA 154, and each elevation bus 142 is structured in communication with an elevation VGA 158. A transmit phase shifter 162 is structured in communication with each transmit VGA 146. A receive phase shifter 166 is structured in communication with each receive VGA 150. An azimuth phase shifter 170 is structured in communication with each azimuth VGA 154. An elevation phase shifter 174 is structured in communication with each elevation VGA 158. In some embodiments, the VGAs are replaced by passive attenuators. In some embodiments, a combination of VGAs and passive attenuators may be used. The VGAs or passive attenuators are considered generally as gain control blocks that are structured to alter the gain according to a weighting distribution. In some embodiments, the phase shifters are replaced by time delay circuits. In some embodiments, a combination of phase shifters and time delay circuits are used. The phase shifters and time delay circuits are considered generally as steering control blocks that affect the direction of the beam.

The RFIC 94 also includes a transmit sum splitter 178 structured in communication with each of the transmit phase shifters 162, a receive sum combiner 182 structured in communication with each of the receive phase shifters 166, an azimuth difference combiner 186 structured in communication with each of the azimuth phase shifters 170, and an elevation difference combiner 190 structured in communication with each of the elevation phase shifters 174. The transmit sum splitter 178, the receive sum combiner 182, the azimuth difference combiner 186, and the elevation difference combiner 190 are structured to communicate with a AESA feed manifold 194 that receives a transmit input 198, a receive output 202, an azimuth output 206, and an elevation output 210.

The VGAs 146, 150, 154, 158 are used to apply weighting. The transmit VGA 146 and the receive VGA 150 are weighted according to a Taylor weighting distribution. The azimuth VGA 154 and the elevation VGA 158 are weighted according to a Bayliss weighting distribution. The separation of the VGAs 146, 150, 154, 158 on the RFIC 94 allows different weighting distributions to be used between sum beams and difference beams. Without this separation, a single weighting distribution must be chosen and a phase shift is used to provide the difference beams. For example, a Taylor weighting distribution may be used, and the difference beams include a one-hundred-eighty degree (180°) phase shift splitting an array of radiating elements in half providing a split Taylor weighting distribution. The Bayliss weighting distribution employed on the RFIC 94 provides significantly improved peak side lobe gain levels and parasitic null filling. The VGAs 146, 150, 154, 158 can also be selectively or intermittently turned off when not in use to conserve power or used to form nulls independently for jamming purposes.

The RFIC 94 provides parallel transmit and receive channels and provide flexibility in transmit/receive communication. There is flexibility relative to the electrical functional partitioning/integration within a chip or unit cell. The number of channels (e.g., inputs and outputs) within a chip and the number of total chip sets required to realize full-sized subarray and full-aperture assemblies can be changed to suit application specific needs. The four resulting monopulse beams (e.g., transmit, receive, azimuth, and elevation) can be repurposed for non-monopulse as a function of system mission phasing (e.g. search, track, ground mapping, etc.) and each of the four beams can be steered independently.

Figure 6:
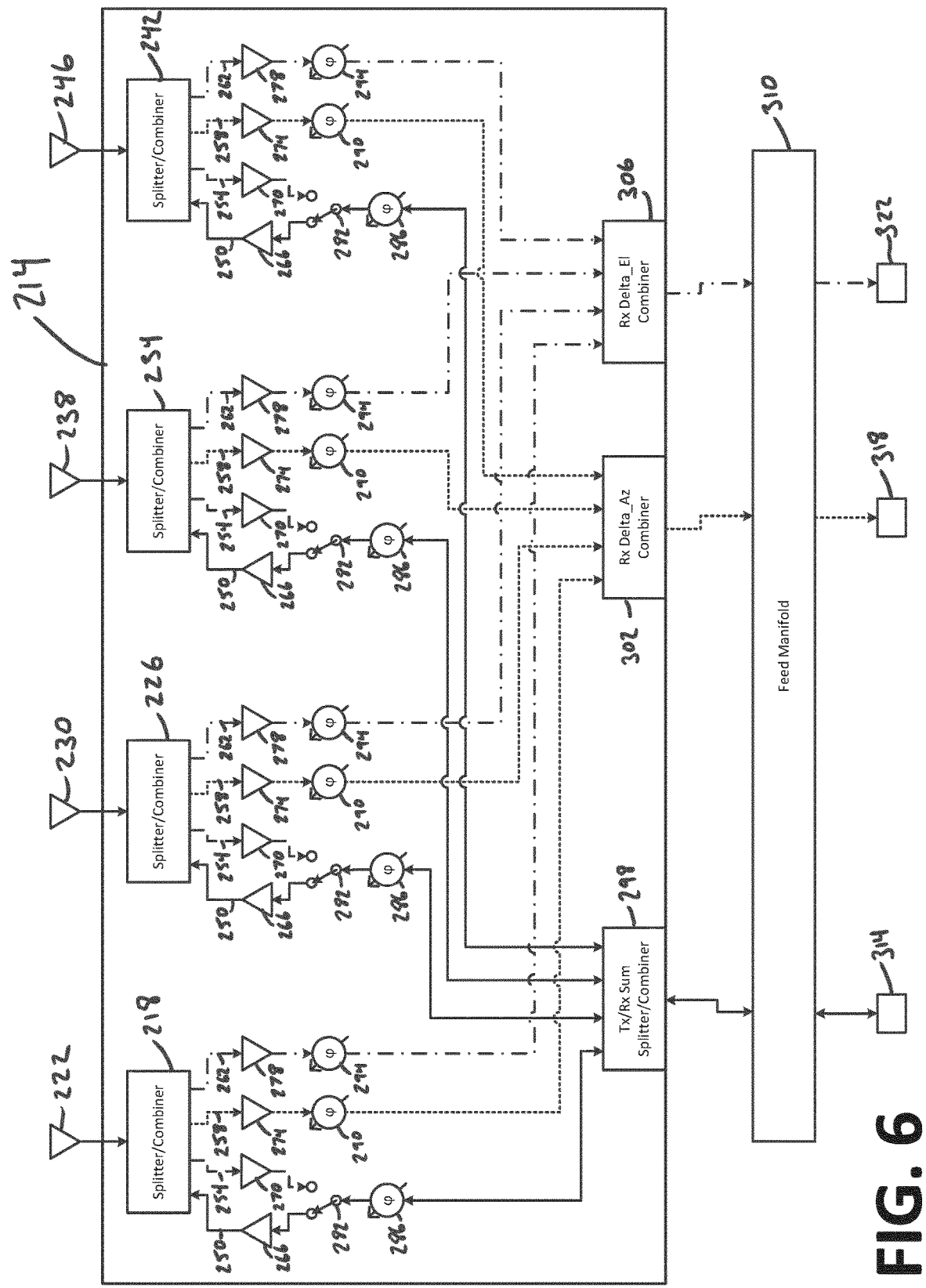
FIG. 6 is a schematic representation of a subarray unit, in accordance with an exemplary embodiment.

Referring now to FIG. 6, an RFIC 214 includes a first splitter/combiner 218 in communication with a first radiating element 222, a second splitter/combiner 226 in communication with a second radiating element 230, a third splitter/combiner 234 in communication with a third radiating element 238, and a fourth splitter/combiner 242 in communication with a fourth radiating element 246. In some embodiments, more than four splitter/combiners or less than four splitter/combiners are included. In some embodiments, thirty-two radiating elements are included in an array.

Each splitter/combiner 218, 226, 234, 242 includes four buses. In some embodiments, more than four buses may be included, for example each splitter/combiner may include eight output buses. Each splitter/combiner 218, 226, 234, 242 includes a transmit bus 250, a receive bus 254, an azimuth bus 258, and an elevation bus 262. Each transmit bus 250 is structured in communication with a transmit VGA 266, each receive bus 254 is structured in communication with a receive VGA 270, each azimuth bus 258 is structured in communication with an azimuth VGA 274, and each elevation bus 262 is structured in communication with an elevation VGA 278.

A multiplexer 282 is coupled between a sum phase shifter 286 and the transmit VGA 266 and the receive VGA 270. The multiplexer 282 allows either the transmit beam or the receive beam to be communicated to the radiating element at any given time. An azimuth phase shifter 290 is structured in communication with the azimuth VGA 274 and an elevation phase shifter 294 is structured in communication with the elevation VGA 278.

The RFIC 214 also includes a transmit/receive sum splitter/combiner 298 structured in communication with each of the sum phase shifters 286, an azimuth difference combiner 302 structured in communication with each of the azimuth phase shifters 290, and an elevation difference combiner 306 structured in communication with each of the elevation phase shifters 294. The transmit/receive sum splitter/combiner 298, the azimuth difference combiner 302, and the elevation difference combiner 306 are structured to communicate with an AESA feed manifold 310 that receives a transmit/receive input 314, an azimuth output 318, and an elevation output 322.

The RFIC 214 replaces separate transmit and receive phase shifters with the shared sum phase shifter 286 and the multiplexer 282. If the transmit and receive patterns are to be different, then the phase shifter 286 and the multiplexer 282 switching times, along with the radar pulse repetition frequency (PRF) and minimum range requirements (as related to propagation delay) are accounted for. The RFIC 214 is capable of dynamic pattern synthesis (shaping) for the receive, azimuth, and elevation beams. The azimuth and elevation beams can be independently steered relative to the transmit and receive beams. The transmit and receive beams are steered in unison and can be used in other modes, such as search or comms, etc. In some embodiments, a second multiplexer is arranged between the transmit VGA 266 and receive VGA 270, and the first splitter/combiner 218. When the second multiplexer is employed, the splitter/combiner 218 can include three buses (i.e., a transmit/receive bus, an azimuth bus, and an elevation bus).

Figure 7:
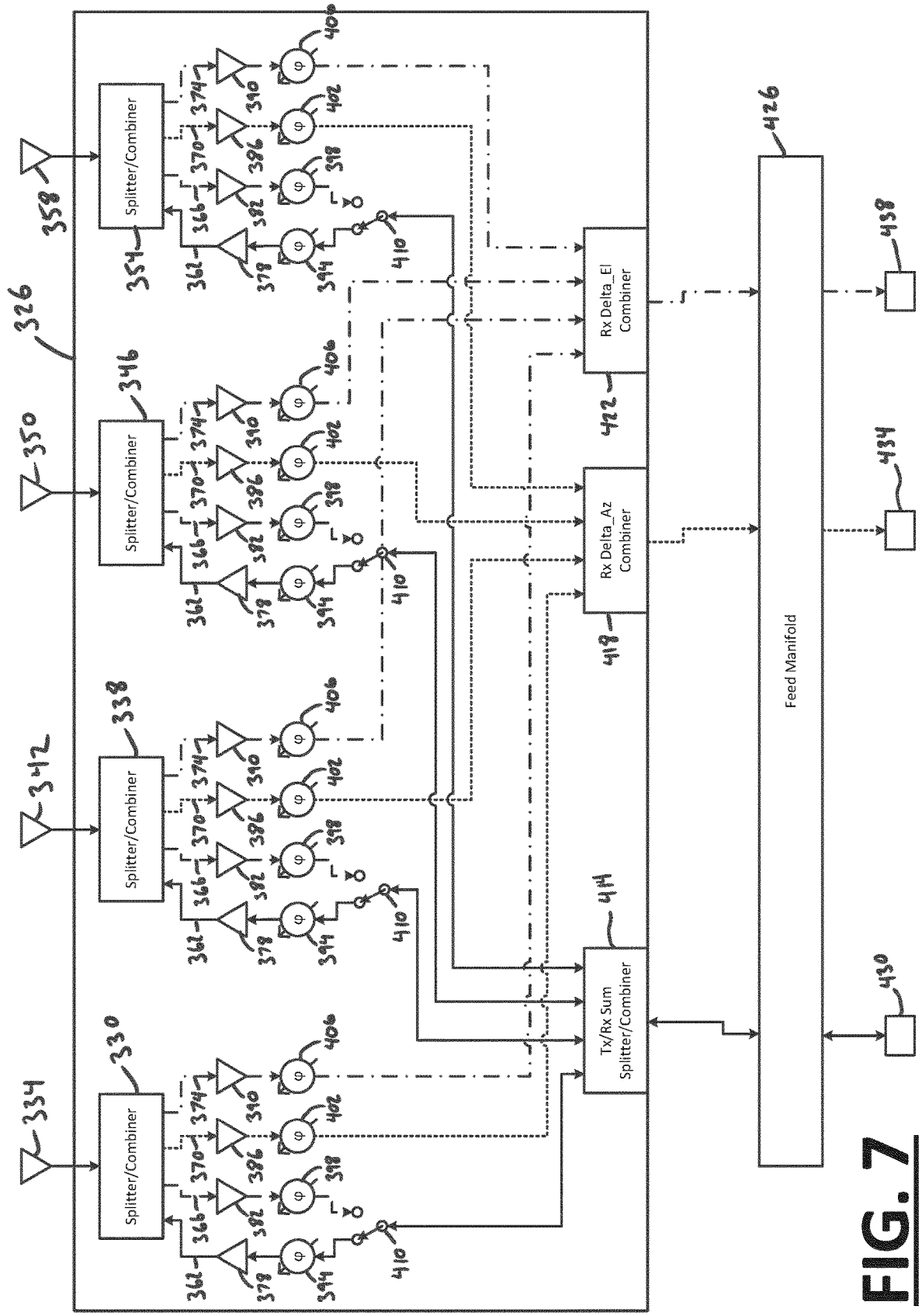
FIG. 7 is a schematic representation of a subarray unit, in accordance with an exemplary embodiment.

Referring now to FIG. 7, an RFIC 326 is similar to the RFIC 214 discussed above with reference to FIG. 6 except that the multiplexer is moved upstream and the receive beam and transmit beam each have independent phase shifters. The RFIC 326 includes a first splitter/combiner 330 in communication with a first radiating element 334, a second splitter/combiner 338 in communication with a second radiating element 342, a third splitter/combiner 346 in communication with a third radiating element 350, and a fourth splitter/combiner 354 in communication with a fourth radiating element 358. In some embodiments, more than four splitter/combiners or less than four splitter/combiners are included. In some embodiments, thirty-two radiating elements are included in an array.

Each splitter/combiner 330, 338, 346, 354 includes four buses. In some embodiments, more than four buses may be included, for example each splitter/combiner may include eight output buses. Each splitter/combiner 330, 338, 346, 354 includes a transmit bus 362, a receive bus 366, an azimuth bus 370, and an elevation bus 374. Each transmit bus 362 is structured in communication with a transmit VGA 378, each receive bus 366 is structured in communication with a receive VGA 382, each azimuth bus 370 is structured in communication with an azimuth VGA 386, and each elevation bus 374 is structured in communication with an elevation VGA 390.

A transmit phase shifter 394 is structured in communication with each transmit VGA 378. A receive phase shifter 398 is structured in communication with each receive VGA 382. An azimuth phase shifter 402 is structured in communication with each azimuth VGA 386. An elevation phase shifter 406 is structured in communication with each elevation VGA 390.

A multiplexer 410 is structured to switch between transmit beams and receive beams upstream of the transmit phase shifter 394 and the receive phase shifter 398. The multiplexer 410 allows either the transmit beam or the receive beam to be communicated to the radiating element at any given time.

The RFIC 326 also includes a transmit/receive sum splitter/combiner 414 structured in communication with each of the multiplexers 410, an azimuth difference combiner 418 structured in communication with each of the azimuth phase shifters 402, and an elevation difference combiner 422 structured in communication with each of the elevation phase shifters 406. The transmit/receive sum splitter/combiner 414, the azimuth difference combiner 418, and the elevation difference combiner 422 are structured to communicate with an AESA feed manifold 426 that receives a transmit/receive input 430, an azimuth output 434, and an elevation output 438.

Figure 8:
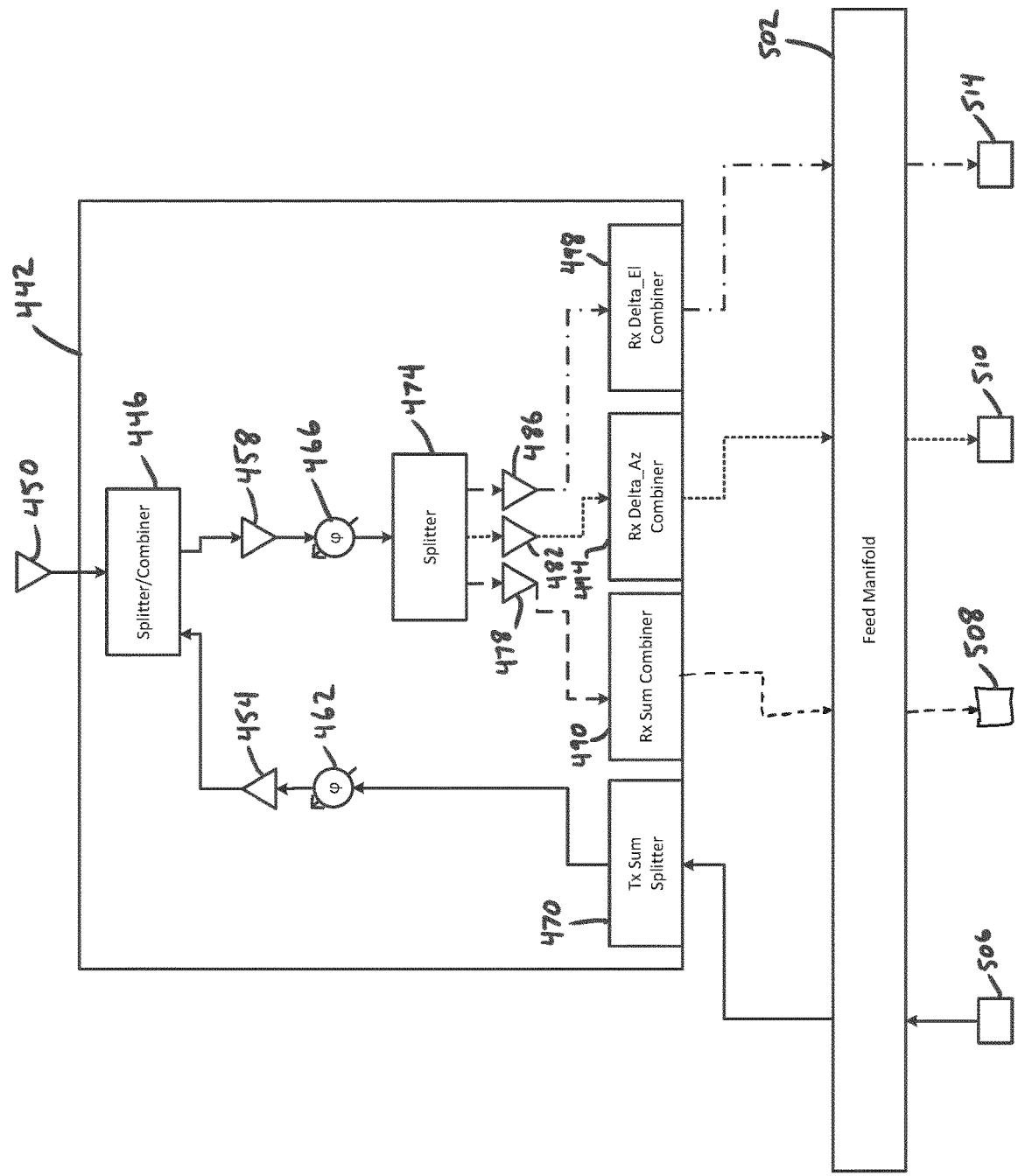
FIG. 8 is a schematic representation of a subarray unit, in accordance with an exemplary embodiment.

Referring now to FIG. 8, an RFIC 442 includes a splitter/combiner 446 associated with a radiation element 450. In some embodiments, the RFIC 442 includes more than one splitter/combiner 446 (e.g., four splitter/combiners and radiating elements may be included). A transmit VGA 454 and a primary VGA 458 are structured in communication with the splitter/combiner 446. A transmit phase shifter 462 is structured in communication with the transmit VGA 454 and a receive phase shifter 466 is structured in communication with the primary VGA 458. The transmit phase shifter 462 communicates with a transmit sum splitter 470.

A receive splitter 474 is structured in communication with the receive phase shifter 466 and provides three output channels. A receive VGA 478, an azimuth VGA 482, and an elevation VGA 486 are structured in communication with the receive splitter 474. A receive sum combiner 490 is structured in communication with the receive VGA 478, an azimuth difference combiner 494 is structured in communication with the azimuth VGA 482, and an elevation difference combiner 498 is structured in communication with the elevation VGA 486.

The transmit sum splitter 470, the receive sum combiner 490, the azimuth difference combiner 494, and the elevation difference combiner 498 are structured to communicate with an AESA feed manifold 502 that receives a transmit input 506, a receive output 508, an azimuth output 510, and an elevation output 514.

The RFIC 442 includes only two phase shifters, one for receiving and one for transmitting. The transmit beam can be steered independently of the three receive beams, and the three receive beams (e.g., the receive beam, the azimuth beam, and the elevation beam) are steered together or in concert. Any phase steps (e.g., a one-hundred-eighty degree (180°) phase step for the difference beams) can be hardwired or handled with hardware in the receive splitter 474. Having separate phase shifters for transmit and receive eases AESA calibration. The primary VGA 458 can be used to provide a baseline gain amplification, and weighting distributions can be applied by the receive VGA 478, the azimuth VGA 482, and the elevation VGA 486. In some embodiments, the primary VGA 458 is eliminated and all gain is provided by the receive VGA 478, the azimuth VGA 482, and the elevation VGA 486.

Figure 9:
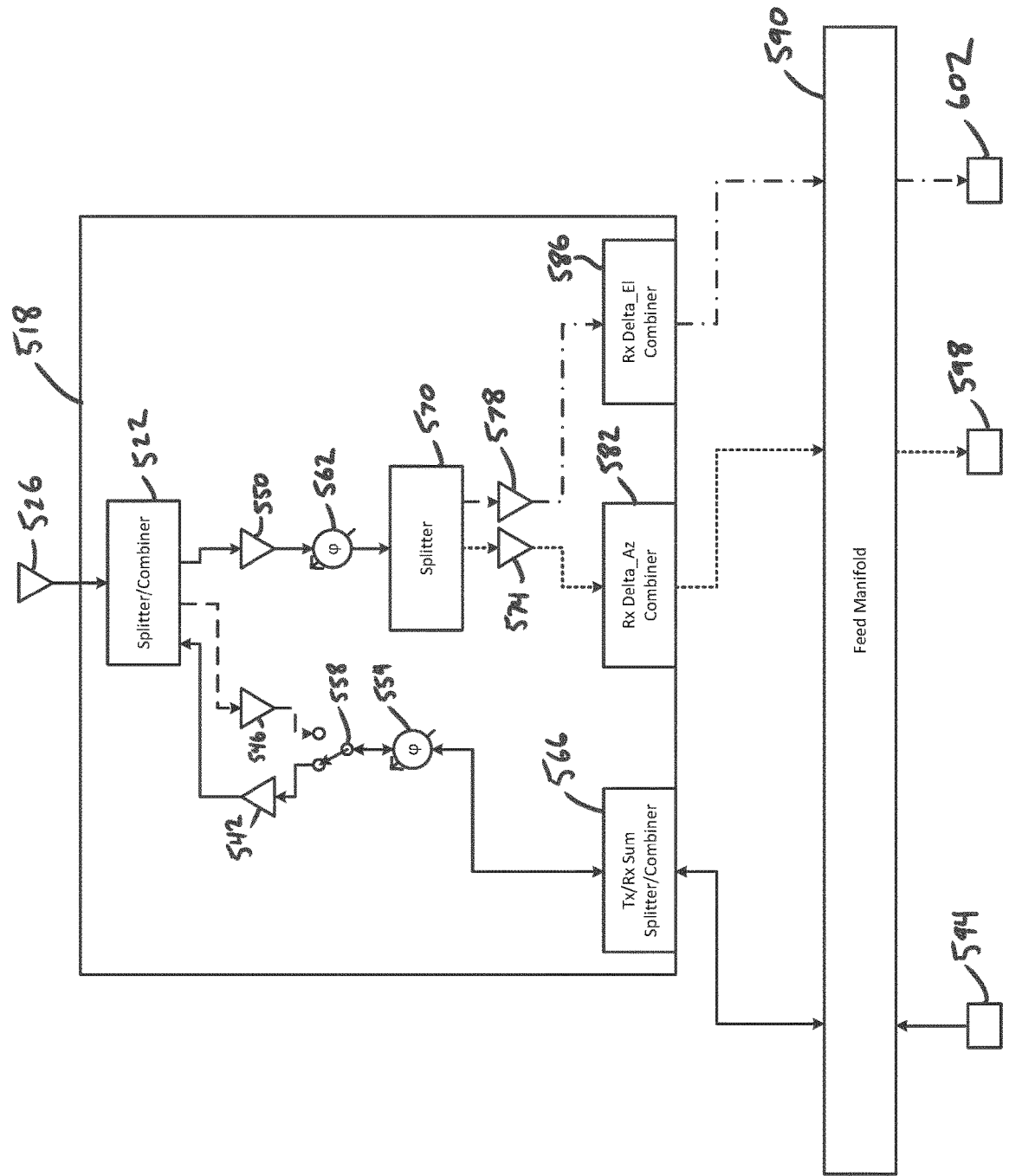
FIG. 9 is a schematic representation of a subarray unit, in accordance with an exemplary embodiment.

Referring now to FIG. 9, an RFIC 518 that is similar to the RFIC 442 discussed above with respect to FIG. 8 but the summed beams (e.g., transmit and receive) share a phase shifter via a multiplexer and the difference beams (e.g., azimuth and elevation) share a primary VGA and phase shifter. The RFIC 518 includes a splitter/combiner 522 associated with a radiation element 526. In some embodiments, the RFIC 518 includes more than one splitter/combiner 522 (e.g., four splitter/combiners and radiating elements may be included). A transmit VGA 542, a receive VGA 546, and a primary VGA 550 are structured in communication with the splitter/combiner 522. A transmit/receive phase shifter 554 structured in communication with the transmit VGA 542 and the receive VGA 546 via a multiplexer 558. A receive phase shifter 562 is structured in communication with the primary VGA 550. The transmit/receive phase shifter 554 communicates with a transmit/receive sum splitter/combiner 566.

A receive splitter 570 is structured in communication with the receive phase shifter 562 and provides two output channels. An azimuth VGA 574 and an elevation VGA 578 are structured in communication with the receive splitter 570. An azimuth difference combiner 582 is structured in communication with the azimuth VGA 574, and an elevation difference combiner 586 is structured in communication with the elevation VGA 578.

The transmit/receive sum splitter/combiner 566, the azimuth difference combiner 582, and the elevation difference combiner 586 are structured to communicate with an AESA feed manifold 590 that receives a transmit/receive input 594, an azimuth output 598, and an elevation output 602.

Figure 10:
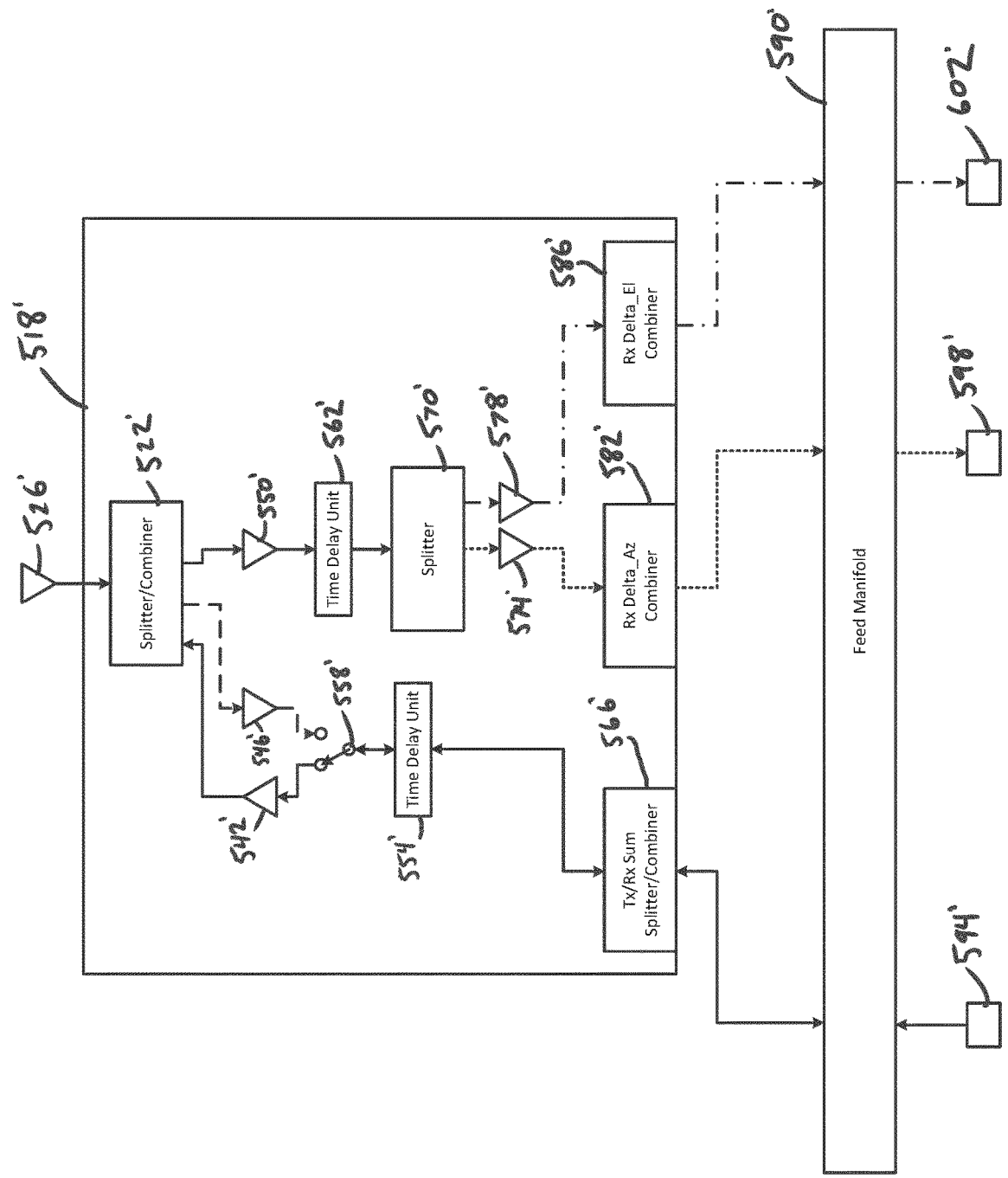
FIG. 10 is a schematic representation of a subarray unit, in accordance with an exemplary embodiment.

Referring now to FIG. 10, an RFIC 518' is similar to the RFIC 518 and like components are labeled with like reference numerals in the prime series. The RFIC 518' replaces the transmit/receive phase shifter 554 with a transmit/receive time delay circuit 554', and replaces the receive phase shifter 562 is replaced with receive time delay circuit 562'.

Narrow band AESAs (i.e., phased array antennas) benefit from phase shifters for beam pointing, and ultra-wide band (UWB) AESAs benefit from time delay circuits (group delay) for beam steering. Phase shifters used in UWB AESAs can lead to beam squint. Phase shifters and time delay circuits are understood to be interchangeable in the above described exemplary embodiments. Likewise, VGAs discussed above are interchangeable with passive attenuators.

Embodiments described above provide Optimized sum and delta beams (for low side lobe levels) for a four-quadrant monopole radar in a highly integrated, small form factor AESA Analog Beam Former (ABF). The ability to repurpose and reconfigure the difference beams (i.e., delta beams), and all beams in general, enables the AESA for multimode operation including search and track, terrain following, SAR imaging, Comms, EW SIGINT, etc. Active subarrays are connected by second layer RFIC combining circuits (e.g., the second layer 58) to seamlessly build up a full-aperture array. The unit cells 54 (e.g., the RFICs 94, 214, 326, 442, 518, 518') can communicate with more than four radiating elements to achieve an N-element array.

In some embodiments, each beam (e.g., four or more beams) can be independently steered, arbitrarily reconfigured, adaptively nulled, "spoiled" for ground illumination, etc. In some embodiments, more than four beams are produced with more than four subarrays or channels to produce multiple phase centers. Dynamic beam shaping as a function of scan is possible with the above described embodiments if the digital control circuitry is appropriately designed for speed. The embodiments above are described relative to a four-quadrant monopulse architecture but are also applicable to SAR radar, ASA radar, achitechures with more than four segments, or other radar schemes.

While the detailed drawings, specific examples, detailed algorithms and particular configurations given describe preferred and exemplary embodiments, they serve the purpose of illustration only. The inventions disclosed are not limited to the specific forms and reticles shown. For example, the methods or operational steps may be performed in any of a variety of sequence of steps. The hardware and optical configurations shown and described may differ depending on the chosen performance characteristics and physical characteristics of the devices. For example, the type of system components and their interconnections may differ. The systems and methods depicted and described are not limited to the precise details and conditions disclosed. The specific mechanical components and operations are shown in a non-limiting fashion. Furthermore, other substitutions, modifications, changes, and omissions may be made in the design, operating conditions, and arrangement of the exemplary embodiments without departing from the scope of the invention as expressed in the appended claims.

What is claimed is:

1. An apparatus, comprising:
   a radio frequency integrated circuit comprising
      a splitter/combiner structured to communicate with a radiating element;
      a sum beam gain control block in communication with the splitter/combiner and structured to apply a Taylor weighting distribution;
      a difference beam gain control block in communication with the splitter/combiner and structured to apply a Bayliss weighting distribution;
      a sum beam steering control block in communication with the sum beam gain control block; and
      a difference beam steering control block in communication with the difference beam gain control block.

2. The apparatus of claim 1, wherein the sum beam gain control block is a transmit gain control block, the radio frequency integrated circuit further comprising a receive gain control block and a multiplexer connecting the transmit gain control block and the receive gain control block to the sum beam steering control block.

3. The apparatus of claim 2, further comprising a feed manifold, and
   wherein the radio frequency integrated circuit further comprises a second multiplexer connecting the transmit gain control block and the receive gain control block to the feed manifold.

4. The apparatus of claim 1, wherein the radio frequency integrated circuit is a first subarray, and wherein the apparatus further includes more than four subarrays having independent transmit and receive beams.

5. The apparatus of claim 1, wherein the difference beam gain control block is an azimuth gain control block, the radio frequency integrated circuit further comprising an elevation gain control block.

6. The apparatus of claim 1, the radio frequency integrated circuit further comprising a splitter in communication with the difference beam steering control block;
   an azimuth gain control block in communication with the splitter; and an elevation gain control block in communication with the splitter.

7. The apparatus of claim 1, wherein the sum beam steering control block and the difference beam steering control block are independently steerable and provide arbitrary amplitude and phase adjustment for real-time pattern synthesis.

8. A system, comprising:
   a radiating element;
   a radio frequency integrated circuit comprising
      a splitter/combiner in communication with the radiating element,
      a transmit beam gain control block in communication with the splitter/combiner and structured to apply a Taylor weighting distribution,
      a receive beam gain control block in communication with the splitter/combiner and structured to apply a Bayliss weighting distribution,
      a transmit beam steering control block in communication with the transmit beam gain control block, and
      a receive beam steering control block in communication with the receive beam gain control block; and
      a feed manifold in communication with the transmit beam steering control block and the receive beam steering control block.

9. The system of claim 8, wherein the receive beam gain control block is an azimuth beam gain control block, the radio frequency integrated circuit further comprising an elevation beam gain control block.

10. The system of claim 8, wherein the radio frequency integrated circuit further comprises a receive sum beam gain control block in communication with the splitter/combiner and structured to apply a second Taylor weighting distribution,
    wherein the second Taylor weighting distribution may include the same or different weights as the Taylor weighting distribution.

11. The system of claim 10, wherein the radio frequency integrated circuit further comprises a multiplexer coupling the receive sum beam control block and the transmit beam gain control block to the splitter/combiner.

12. The system of claim 8, wherein the radio frequency integrated circuit further comprises a splitter in communication with the receive beam steering control block, an azimuth gain control block in communication with the splitter, and an elevation gain control block in communication with the splitter.

13. The system of claim 8, wherein the transmit beam steering control block and the receive beam steering control block are independently steerable.

14. The system of claim 8, wherein the feed manifold is in communication with a second radio frequency integrated circuit.

15. A method of assembling an antenna array, the method comprising:
    providing a feed manifold;
    coupling a plurality of radio frequency integrated circuits to the feed manifold, each radio frequency integrated circuit comprising
       a splitter/combiner,
       a transmit beam gain control block in communication with the splitter/combiner and structured to apply a Taylor weighting distribution,
       a receive beam gain control block in communication with the splitter/combiner and structured to apply a Bayliss weighting distribution,
       a transmit beam steering control block in communication with the transmit beam gain control block, and
       a receive beam steering control block in communication with the receive beam gain control block; and
    coupling a plurality of radiating elements to the plurality of radio frequency integrated circuits, each radiating element in communication with an associated splitter/combiner.

16. The method of claim 15, wherein each receive beam gain control block is an azimuth beam gain control block, and each radio frequency integrated circuit further comprising an elevation beam gain control block.

17. The method of claim 15, wherein each radio frequency integrated circuit further comprises a receive sum beam gain control block in communication with the splitter/combiner and structured to apply a second Taylor weighting distribution,
   wherein the second Taylor weighting distribution may include the same or different weights as the Taylor weighting distribution.

18. The method of claim 17, wherein each radio frequency integrated circuit further comprising a multiplexer coupling the receive sum beam control block and the transmit beam gain control block to the splitter/combiner.

19. The method of claim 15, wherein each radio frequency integrated circuit further comprises a splitter in communication with the receive beam steering control block, an azimuth gain control block in communication with the splitter, and an elevation gain control block in communication with the splitter.

20. The method of claim 15, wherein each transmit beam steering control block and each receive beam steering control block are independently steerable.

21. An apparatus, comprising:
   a radio frequency integrated circuit comprising
      a splitter/combiner structured to communicate with a radiating element;
      a sum beam gain control block in communication with the splitter/combiner and structured to apply a Taylor weighting distribution, wherein the sum beam gain control block is a transmit gain control block;
      a sum beam steering control block in communication with the sum beam gain control block;
      a difference beam gain control block in communication with the splitter/combiner and structured to apply a Bayliss weighting distribution, wherein the difference beam gain control block is a receive gain control block;
      a difference beam steering control block in communication with the difference beam gain control block; and
      a multiplexer connecting the transmit gain control block and the receive gain control block to the sum beam steering control block.

22. The apparatus of claim 21, further comprising a feed manifold, and wherein the radio frequency integrated circuit further comprises a second multiplexer connecting the transmit gain control block and the receive gain control block to the feed manifold.

* * * * *